US008237599B2

(12) United States Patent
Marrero et al.

(10) Patent No.: US 8,237,599 B2
(45) Date of Patent: Aug. 7, 2012

(54) ANALOG-TO-DIGITAL CONVERTER IN A MOTOR CONTROL DEVICE

(75) Inventors: Joe A. Marrero, Tucson, AZ (US); Lynn R. Kern, Tucson, AZ (US); Scott C. McLeod, Oro Valley, AZ (US)

(73) Assignee: Standard Microsystems Corporation, Hauppauge, NY (US)

( * ) Notice: Subject to any disclaimer, the term of this patent is extended or adjusted under 35 U.S.C. 154(b) by 248 days.

(21) Appl. No.: 12/627,734

(22) Filed: Nov. 30, 2009

(65) Prior Publication Data
US 2011/0128085 A1 Jun. 2, 2011

(51) Int. Cl.
*H03M 1/56* (2006.01)
(52) U.S. Cl. ........ 341/169; 341/116; 341/122; 341/155; 341/170
(58) Field of Classification Search .......... 341/122–125, 341/164, 165, 169, 170
See application file for complete search history.

(56) References Cited

U.S. PATENT DOCUMENTS

| | | | | |
|---|---|---|---|---|
| 3,820,033 | A | * | 6/1974 | Iwata ............................... 327/94 |
| 4,417,234 | A | * | 11/1983 | McKenna ....................... 341/141 |
| 4,573,037 | A | | 2/1986 | Robinton et al. |
| 5,450,082 | A | * | 9/1995 | Finley et al. .................. 341/141 |
| 5,693,044 | A | * | 12/1997 | Cosmescu ....................... 606/42 |
| 5,907,299 | A | | 5/1999 | Green et al. |
| 6,225,937 | B1 | * | 5/2001 | Butler ............................ 341/169 |
| 6,346,907 | B1 | * | 2/2002 | Dacy et al. .................... 341/169 |
| 6,943,713 | B1 | * | 9/2005 | Pitot et al. ..................... 341/141 |
| 7,062,159 | B1 | * | 6/2006 | Borrello et al. ............... 388/801 |
| 7,148,831 | B2 | * | 12/2006 | Krymski ....................... 341/155 |
| 7,158,067 | B2 | | 1/2007 | Lauritzen et al. |
| 7,227,487 | B1 | * | 6/2007 | Midya et al. .................. 341/152 |
| 7,352,311 | B2 | | 4/2008 | Miller et al. |
| 7,612,702 | B2 | | 11/2009 | Danesh |
| 2004/0080962 | A1 | * | 4/2004 | Charych ..................... 363/21.11 |
| 2005/0088331 | A1 | * | 4/2005 | Krymski ....................... 341/169 |
| 2006/0220941 | A1 | * | 10/2006 | Lee ............................... 341/155 |
| 2008/0180299 | A1 | * | 7/2008 | Forejt ............................. 341/166 |
| 2009/0129537 | A1 | * | 5/2009 | Rao et al. .......................... 378/4 |

OTHER PUBLICATIONS

Ken Berringer, Bill Lucas, Leos Chalupa, and Libor Prokop; "Sensorless Brushless DC Motor Using the MC68HC908MR32 Embedded Motion Control Development System—AN1858"; Freescale Semiconductor; 2004; 36 pages.
"Sensorless Motor Control IC for Appliances—IRMCF371"; International Rectifier; Dec. 5, 2006; 30 pages.
Jorge Zambada; "Sensorless Field Oriented Control of PMSM Motors—AN1078"; Microchip; 2007; 30 pages. "Sensorless Spindle Motor Controller—ML4411/ML4411A"; Micro Linear; May 1997; 15 pages.
"Brushless DC Motor Drive Circuit—TDA5140A"; Philips Semiconductors; Apr. 1994; 24 pages.
"Fan Motor Driver—LV8800V"; Sanyo; Aug. 2007; 8 pages.
"Sensorless Brushless DC Motor Reference Design—AN208"; Silicon Labs; 2006; 40 pages.
"Sensorless Brushless DC Motor Control with Z8 Encore! MC Microcontrollers—AN022601-0905"; ZiLOG; 2005; 64 pages.

* cited by examiner

*Primary Examiner* — Linh Nguyen
(74) *Attorney, Agent, or Firm* — Meyertons Hood Kivlin Kowert & Goetzel, P.C.; Jeffrey C. Hood

(57) ABSTRACT

System and method for digitizing analog voltage signals. A first voltage signal may be received at a comparator. A ramp signal may be received at the comparator. The ramp signal may be generated by a ramp generator. An output signal may be generated by the comparator. The output signal may indicate whether the analog voltage signal or the ramp signal is greater. The output signal may be conveyed to logic circuitry by the comparator. Control information may be conveyed by the logic circuitry to the ramp generator. The ramp generator may generate the ramp signal based on the control information. The logic circuitry may determine a digital representation of the first voltage signal based on the output signal from the comparator and the control information.

18 Claims, 3 Drawing Sheets

ANALOG-TO-DIGITAL CONVERTER IN A MOTOR CONTROL DEVICE

BACKGROUND OF THE INVENTION

1. Field of the Invention

The invention generally relates to a novel implementation of an analog-to-digital converter (ADC), and in some embodiments to an ADC configured for use in direct current (DC) motors such as might be used in various applications, such as hard disk drive motors, cooling fans, drive motors for appliances, etc.

2. Description of the Related Art

An electric motor uses electrical energy to produce mechanical energy. Electric motors are used in a large number of applications, including a number of different household appliances, pumps, cooling fans, etc. Motors can generally be classified as either alternating current (AC) motors or direct current (DC) motors.

Motors generally include a rotor, which is the non-stationary (moving) part of the motor, and a stator, which is the stationary part of the motor. The stator generally operates as a field magnet (e.g., electromagnet), interacting with an armature to induce motion in the rotor. The wires and magnetic field of the motor (typically in the stator) are arranged so that a torque is developed about the rotor's axis, causing rotation of the rotor. A motor typically also includes a commutator, which is an electrical switch that periodically reverses the current direction in the electric motor, helping to induce motion in the rotor. The armature carries current in the motor and is generally oriented normal to the magnetic field and the torque being generated. The purpose of the armature is to carry current crossing the magnetic field, thus creating shaft torque in the motor and to generate an electromotive force ("EMF").

In a typical brushed DC motor, the rotor comprises one or more coils of wire wound around a shaft. Brushes are used to make mechanical contact with a set of electrical contacts (called the commutator) on the rotor, forming an electrical circuit between the DC electrical source and the armature coil-windings. As the armature rotates on axis, the stationary brushes come into contact with different sections of the rotating commutator. The commutator and brush system form a set of electrical switches, each firing in sequence, such that electrical-power always flows through the armature coil closest to the stationary stator (permanent magnet). Thus an electrical power source is connected to the rotor coil, causing current to flow and producing electromagnetism. Brushes are used to press against the commutator on the rotor and provide current to the rotating shaft. The commutator causes the current in the coils to be switched as the rotor turns, keeping the magnetic poles of the rotor from ever fully aligning with the magnetic poles of the stator field, hence maintaining the rotation of the rotor. The use of brushes creates friction in the motor and leads to maintenance issues and reduced efficiency.

In a brushless DC motor design, the commutator/brushgear assembly (which is effectively a mechanical "rotating switch") is replaced by an external electronic switch synchronized to the rotor's position. Brushless DC motors thus have an electronically controlled commutation system, instead of a mechanical commutation system based on brushes. In a brushless DC motor, the electromagnets do not move, but rather the permanent magnets rotate and the armature remains static. This avoids the problem of having to transfer current to the moving armature. Brushless DC motors offer a number of advantages over brushed DC motors, including higher efficiency and reliability, reduced noise, longer lifetime (no brush erosion), elimination of ionizing sparks from the commutator, and overall reduction of electromagnetic interference (EMI).

One technique used to reduce power in some applications has been the introduction of Three Phase Brushless Motors. The drive electronics for these motors typically rely on Hall elements (Hall effect sensors) to detect the absolute position of the rotor at all times, and switch drive transistors to maintain motor rotation. A Hall effect sensor is a transducer that varies its output voltage in response to changes in magnetic field. The motors are often electrically connected in a "Y" configuration, so named due to the resemblance to the letter "Y". The common point for the three coils is connected to the electrical source, and the drive electronics switch the drive transistors to maintain the rotating electro-magnetic field required to turn the motor.

A second method requires the use of six (6) drive transistors. In this configuration, one high-and low-side pair are on at any point in time, completing the electrical circuit through two of the three legs of the motor. Using the un-energized coil as a magnetic sensor to determine the rotor position is known as Back Electro-Motive Force (BEMF) detection. The motivation for this technique is the elimination of the relatively expensive Hall elements and associated electronics. BEMF commutation techniques have successfully been applied to a wide-range of motors.

In order to control the speed of the motor to the command given (either voltage or PWM duty cycle), an error signal is typically developed. The theoretical method is to measure slope of the BEMF signal as the rotor passes the stator coil and use that information to determine the position of the rotor. The idea is if the BEMF signal if offset from its midpoint, this indicates the rotor is deviating from the electrical commutation. If the BEMF signal is too high and early, this indicates the rotor is spinning faster than the electrical commutation. Likewise, a BEMF signal that is too low and late indicates the rotor is spinning slower than the electrical commutation.

Developing this type of error signal in digital circuitry in the past has required a microcontroller or microprocessor, and a high speed Analog-to-Digital converter (ADC). The alternative was to develop analog circuitry to generate reference pulse trains, and use analog components to phase lock to the BEMF signal. All of these solutions typically involve significant cost, complexity, and relatively large or multiple chips and external components. A simpler, more elegant way of implementing an ADC, for example such that the microcontroller(s), phase lock loops, and/or complex proportional-integral-derivative (PID) control required by previous solutions are not necessary, would be desirable. In particular, such an ADC that can detect both the positive and negative slopes of a BEMF signal required for brushless motor control would be desirable.

SUMMARY OF THE INVENTION

Various embodiments are presented of a system and method for digitizing analog voltage signals. The system may include a ramp generator, one or more comparators, and logic circuitry. The ramp generator may be coupled to the one or more comparators in such a way as to provide a ramp signal as an input signal to the one or more comparators. Each of the one or more comparators may also be configured to receive a first voltage signal. The ramp generator may also be coupled to the logic circuitry to receive control information from the logic circuitry. The one or more comparators may be coupled to the logic circuitry to provide an output from each of the one or more comparators to the logic circuitry.

In some embodiments, the system may also include a sample and hold circuit, which may in some embodiments be a differential sample and hold circuit. The sample and hold circuit may be configured to receive the first voltage signal and convey the first voltage signal to the one or more comparators. In some embodiments (e.g., if the sample and hold circuit is a differential sample and hold circuit), the sample and hold circuit may be configured to receive a sampled voltage signal and a first reference voltage signal, and produce the first voltage signal. In some embodiments, the ramp generator may also be configured to receive a reference voltage signal (e.g., a second reference voltage signal). The first reference voltage signal and the second reference voltage signal may in some embodiments be based upon a common base reference voltage signal. It should be noted that the voltage signals referred to in the above paragraphs may be analog voltage signals. In some embodiments, the sample and hold circuit and/or any of the one or more comparators may be configured to reduce their offset voltages, e.g., may have "auto-zeroing" capabilities.

The system may be configured to implement a method for digitizing analog voltage signals. For example, the method may be implemented as described below. A first voltage signal may be received at a comparator. A ramp signal may be received at the comparator. The ramp signal may have been generated by the ramp generator. According to some embodiments, the ramp signal may be a triangular ramp signal. The comparator may generate an output signal. The output signal may indicate whether the analog voltage signal or the ramp signal is greater. In some embodiments, the output signal may comprise a digital pulse train. The comparator may convey the output signal to the logic circuitry. The logic circuitry may also convey control information to the ramp generator, which the ramp generator may use in generating the ramp signal. The logic circuitry may determine a digital representation of the first voltage signal based on the output signal from the comparator and the control information which the logic circuitry conveys to the ramp generator.

In some embodiments, the method may also include receiving the first voltage at the sample and hold circuit, and conveying the first voltage signal from the sample and hold circuit to the comparator. In some embodiments (e.g., if the sample and hold circuit is a differential sample and hold circuit), the method may include receiving a sampled voltage signal and receiving a first reference voltage signal at the sample and hold circuit. The sample and hold circuit may then convey the first voltage signal to the comparator. The first voltage signal may be a differential voltage signal based on a difference between the sampled voltage signal and the first reference voltage signal.

In some embodiments, the one or more comparators may comprise two comparators. The sample and hold circuit may thus be coupled to each comparator, and may be configured to convey the first voltage signal to one of the two comparators based on a sign of the first voltage signal.

In some embodiments, the method may also include the ramp generator receiving a second reference voltage signal. The second reference voltage signal may be used by the ramp generator (e.g., in addition to the control information from the logic circuitry) to generate the ramp signal. The second reference voltage signal and the first reference voltage signal may both be proportional to a base reference voltage signal.

In some embodiments, the control information conveyed from the logic circuitry to the ramp generator may be a clock signal. Thus, in some embodiments, generation of the ramp signal by the ramp generator may be based on a clock signal and a reference voltage. Similarly, in some embodiments, determination of the digital representation of the first voltage signal may be based on the clock signal and the output of the one or more comparators.

Figure 1:
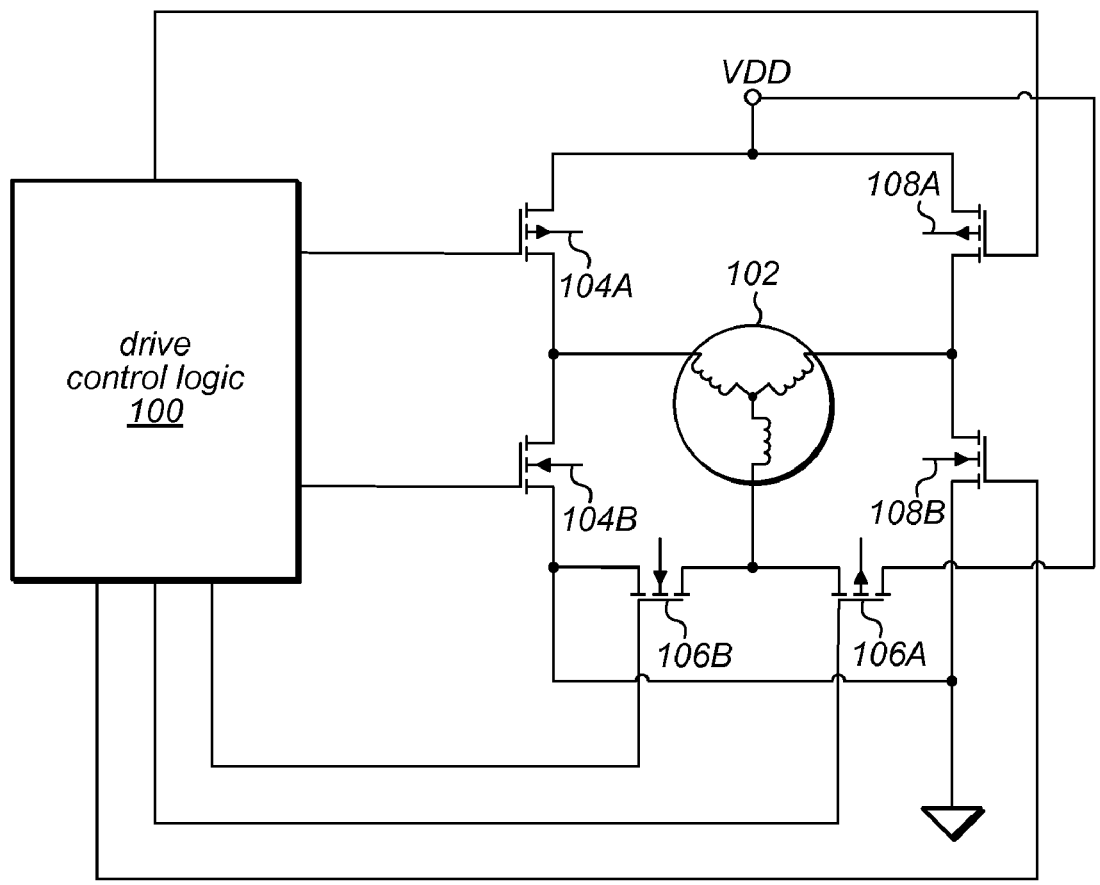
FIG. 1 is a circuit diagram of a motor with drive control logic according to one embodiment.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE EMBODIMENTS

The present disclosure relates to a novel implementation of an analog-to-digital converter (ADC). The following description is largely directed one particular set of implementations of an ADC, e.g., for use in motor drive control. It is believed that many of the embodiments described herein may be particularly suitable for use in such applications. However, it will be readily recognized that many of the embodiments described herein and variations of the embodiments described herein may also or alternatively be suitable for any of various other applications that utilize an ADC.

FIG. 1—Circuit Diagram of a Motor with Drive Control Logic

FIG. 1 illustrates a simplified circuit diagram of a motor and its drive control logic 100 that might require an ADC. In one embodiment, the motor may be a brushless, three-phase motor. Thus, the motor may include a stator 102, which may include three pairs of electromagnets. Each pair of electromagnets may have a corresponding pair of transistors 104A-B, 106A-B, 108A-B, e.g., field effect transistors (FETs). The transistors for each pair of electromagnets may be controlled by drive control logic 100. The drive control logic 100 may be electronic logic configured to perform various operations for controlling the motor.

One of the operations the drive control logic 100 may need to perform in order to control the motor may include sampling voltages and converting those voltages to digital values. For example, in order to accurately control the motor, it may be necessary to acquire an indication of the position of the rotor. For example, the motor may include Hall sensors for sensing the position of the motor, or may utilize BEMF voltages induced across the electromagnets. In either case, sampled voltages may need to be converted to digital values for use by the drive control logic 100 in controlling the motor. Thus, at least in some embodiments, the drive control logic 100 may include an ADC, such as an ADC according to any of the embodiments described below with respect to FIGS. 2 and 3, for determining digital representations of analog voltage signals.

Figure 2:
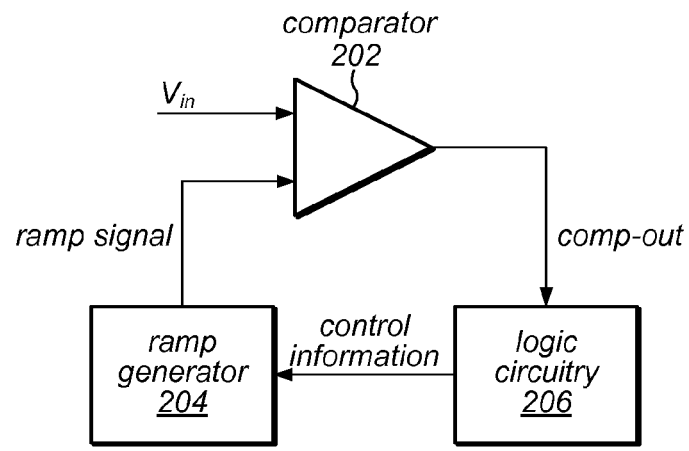
FIGS. 2 and 3 are circuit diagrams illustrating exemplary embodiments of an analog-to-digital converter.

FIG. 2—Circuit Diagram of an Analog-to-Digital Converter

FIG. 2 is a high-level circuit diagram showing an Analog-to-Digital Converter (ADC) according to one embodiment.

The ADC may be configured to determine a digital representation of an analog input voltage, that is, to convert an analog signal to a digital signal. The ADC may include a comparator 202, a ramp generator 204, and logic circuitry 206, coupled together in such a way as to provide the signal flow shown in FIG. 2. In various embodiments, the ADC may additionally be configured with one or more other circuit elements, as desired. For example, the ADC of FIG. 3 may be an exemplary implementation of the ADC of FIG. 2 with several possible additional circuit components. It will accordingly be recognized that any number of other circuit components besides those shown in FIG. 2 are also possible according to various embodiments. Embodiments are also contemplated in which the ADC described herein forms a circuit portion in a larger circuit; for example, the ADC might be implemented as part of an integrated circuit in drive control logic 100 for controlling a motor as shown in FIG. 1, in some embodiments. In addition, it should be noted that each of the circuit elements shown and described herein (e.g., comparators, ramp generators, signal and hold circuits, etc.) may be implemented in any of a variety of ways, and the use of these terms should not be considered limited to any specific implementations, but should be considered representative of any circuit element which is configured to provide the functionality described with respect thereto.

According to some embodiments, the signal flow of the ADC may be summarized as follows. The comparator 202 may be configured to receive an input voltage as well as a ramp signal. The ramp signal may be conveyed to the comparator via a coupling from the ramp generator 204; the ramp generator 204 may also be coupled to the logic circuitry 206. The coupling between the logic circuitry 206 and the ramp generator 204 may be used to convey control information (e.g., information used by the ramp generator in generating the ramp signal) from the logic circuitry 206 to the ramp generator 204. The logic circuitry may also be coupled to the comparator 202 in such a way as to receive an output signal from the comparator 202. The output signal from the comparator 202 may indicate whether the input voltage or the ramp signal is greater.

As described above, the logic circuitry 206 may provide control information to the ramp generator. In some embodiments, the logic circuitry 206 may include a system clock, which may generate a clock signal. The control information conveyed from the logic circuitry to the ramp generator may include the clock signal. The ramp generator 204 may thus receive the clock signal, and may generate the ramp signal based on the clock signal. For example, the frequency and/or the amplitude of the ramp signal may be based on the clock signal. Since the ramp signal may be based on the system clock, the logic circuitry 206 may be able to determine a digital representation of the voltage of the ramp signal at any given time.

The comparator 202, as noted above, may be configured to compare the voltages of an input voltage and the ramp signal. Thus, at the trough of the ramp signal, the output of the comparator may indicate that the input voltage is greater. As the ramp signal increases (i.e., ramps up), the voltage of the ramp signal will eventually become greater than the input voltage. At this time, the comparator will switch outputs, indicating that the ramp signal is greater. Thus, in some embodiments, when the output of the comparator switches, the logic circuitry 206 may determine the corresponding digital representation of the voltage of the ramp signal (e.g., using a counter calibrated with the ramp generator), which will potentially match the input voltage with a high degree of accuracy.

Other ways of using the ramp generator and the comparator to determine a digital representation of the analog input voltage are also contemplated. For example, in some embodiments, the ramp generator 204 may generate a triangular ramp signal, e.g., whose maximum voltage is programmable and which synchronizes to the system clock frequency. In this case, the comparator may switch its output as the ramp signal crosses the input voltage signal both on the rising edge of the ramp signal and the falling edge of the ramp signal, producing a digital serial pulse train. Because the logic circuitry knows the frequency and amplitude of the ramp signal (e.g., based on the control information the logic circuitry provides to the ramp generator), this pulse train may be used by the logic circuitry to determine a digital representation of the analog input voltage.

Since the ramp-based comparison with the input voltage may not provide an instantaneous result, in some embodiments the ADC may further include a sample and hold circuit, e.g., in order to maintain the sampled input voltage at a substantially constant value while the sampled input voltage is being converted. The sample and hold circuit may thus receive a sampled voltage and hold it as a steady input to the comparator while the ADC function is being performed. In some embodiments, the sample and hold circuit may simply provide an input voltage to the comparator which is substantially identical to the sampled voltage; alternatively, the sample and hold circuit may provide amplification, and/or other modifications to the sampled voltage. For example, in the embodiment shown in FIG. 3 (as will be described further with respect thereto), the sample and hold circuit may be a differential sample and hold circuit.

As is known in the art, circuit elements such as comparators and sample and hold circuits may typically have inherent temperature- and/or process-dependent offset voltages. Since these offset voltages could have a significant effect on the accuracy of an analog-to-digital conversion, it may be desirable in some embodiments to utilize such circuit components which have "auto-zeroing" capabilities. In other words, one or more of the comparator(s) and/or sample and hold circuit may be configured to reduce (e.g., by estimating and cancelling out) their offset voltages.

Figure 3:
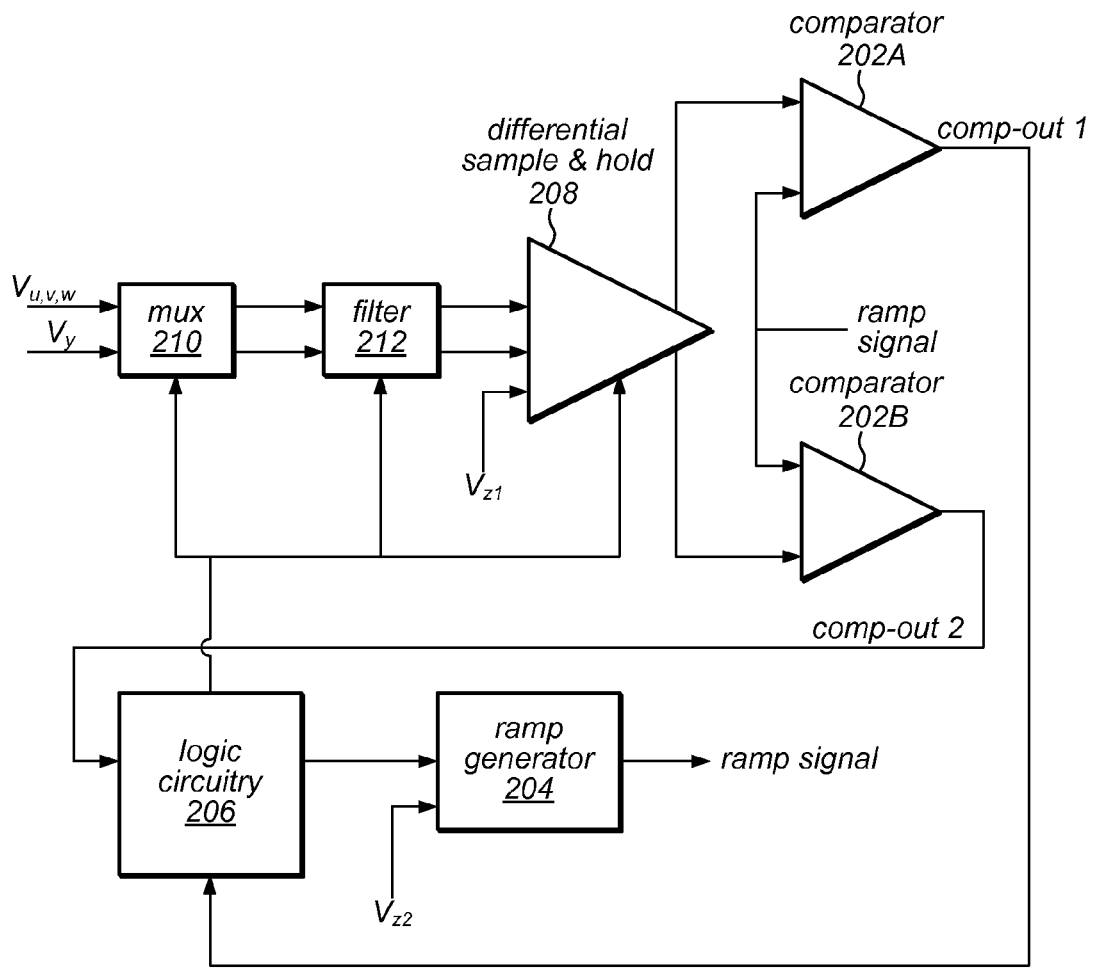

FIG. 3—Circuit Diagram of an Analog-to-Digital Converter

FIG. 3 is a high-level circuit diagram showing an ADC according to one embodiment. In some embodiments, an ADC such as shown in FIG. 3 may be used in motor drive control circuitry; for example, the potential capacity of the ADC shown in FIG. 3 to detect both positive and negative slopes (as will be described below) may make the ADC suitable for use with the BEMF voltages required for motor control in many cases.

Like the ADC shown in FIG. 2, the ADC shown in FIG. 3 may be configured to determine a digital representation of an analog input voltage; the ADC shown in FIG. 3 includes the circuit elements shown in FIG. 2, and may thus indeed be considered an example of one possible expanded implementation of the ADC shown in FIG. 2. Thus, as with the ADC shown in FIG. 2, in various embodiments, the ADC may additionally be configured with one or more other circuit elements, as desired; alternatively, or in addition, one or more of the circuit elements shown in FIG. 3 may not be required in some embodiments. Embodiments are also contemplated in which the ADC forms a circuit portion of a larger circuit. As with the circuit shown in FIG. 2, it should be noted that each of the circuit elements shown and described herein (e.g., comparators, ramp generators, signal and hold circuits, etc.) may be implemented in any of a variety of ways, and the use of these terms should not be considered limited to any specific implementations, but should be considered representative of any circuit element which is configured to provide the functionality described with respect thereto.

Much as described with respect to FIG. 2, the ADC may include logic circuitry 206 and a ramp generator 204. According to some embodiments, the logic circuitry 206 may thus provide control information (e.g., clock signals) to the ramp generator, which may be used in generating a ramp signal (e.g., a triangular ramp signal). The ADC may include two comparators 202A, 202B, which may each receive the ramp signal, and which may each provide an output to the logic circuitry 206. Although the ramp signal is shown as being provided to the inverting input of comparator 202A and the non-inverting input of comparator 202B, in some embodiments the ramp signal may be may be provided to the non-inverting input (or the inverting input) for both comparators; the configuration of comparator inputs may be configured in combination with the sample and hold circuit 208 and/or the logic circuitry 206.

The sample and hold circuit 208, which may be coupled to each of the comparators in such a way as to provide an input to each comparator, may be a differential sample and hold circuit 208. The differential sample and hold circuit may be configured to receive two (or more) input voltages, e.g., a sampled input voltage and a first reference input voltage. The differential sample and hold 208 may thus provide differential voltages as input voltages to the comparators 202A, 202B. It should be noted that although the input voltage to comparator 202A is shown as being provided to the non-inverting input of comparator 202A while the input voltage to comparator 202B is shown as being provided to the inverting input of comparator 202B, in some embodiments (e.g., if the ramp signal is provided to the inverting (or non-inverting) input of both comparators), the input signals from the differential sample and hold 208 may be provided to non-inverting (or inverting) input of both comparators. Furthermore, in some embodiments, the differential sample and hold 208 may be configured to provide two different outputs; for example, the differential sample and hold may be configured to provide a positive differential voltage as the input voltage to one comparator and a negative differential voltage as the input voltage to the other comparator. Thus, in such cases, one comparator may receive a first (e.g., positive) input voltage, while the other comparator may receive a second (e.g., negative) input voltage.

Consider, then, an embodiment in which comparator 202A receives a positive differential input voltage from differential sample and hold 208, while comparator 202B receives a negative differential input voltage from differential sample and hold 208. The comparators may each also receive the ramp signal from the ramp generator 204. For this example, consider a triangular ramp signal whose frequency and amplitude are determined by the control information (e.g., a clock signal) from the logic circuitry 206. Each comparator will then produce a digital pulse train as its output. Based on the width of the pulses (and the control information used to generate the ramp signal), the logic circuitry may be able to accurately determine a digital representation of the input voltage. Additionally, in some embodiments, the outputs of the comparators may be coupled to an XOR gate (e.g., either before or within the logic circuitry), in order to form the digital pulse train to the logic circuitry, if desired.

In some embodiments, the ramp generator and the differential sample and hold circuits may also make use of reference voltages, e.g., based on a reference voltage provided by a bandgap voltage reference. For example, embodiments are considered in which the differential voltage (based on the sampled voltage and the first reference voltage) is offset at the differential sample and hold 208 by a second reference voltage, while the ramp signal is offset at the ramp generator by a third reference voltage. The second and third reference voltages may both be based on the same base reference voltage (e.g., provided by a bandgap voltage reference); for example, each may be proportional to the base reference—in some embodiments, the second and third reference voltages may be even the same. The second and third reference voltages are shown in FIG. 3 as $V_{z1}$ and $V_{z2}$ respectively. It should also be noted that commonly based reference voltages $V_{z1}$ and $V_{z2}$ to the signal and hold and the ramp generator may be used even in embodiments in which the "first reference voltage" is not used.

As shown in FIG. 3, the ADC may also include a mux 210 and a filter 212 in some embodiments. For example, if the ADC is used in drive control logic, e.g., to perform analog to digital conversion on sampled BEMF voltages, there may be more than one sampled voltage source. In a three phase motor, there may typically be three sets of coils which may be used to sample BEMF voltages at different times. Mux 210 may thus be used to select a voltage channel (e.g., $V_u$, $V_v$, or $V_w$ for coil sets U, V, and W respectively) from which a voltage may be sampled. The sampled voltage may be conveyed through filter 212 (which may perform one or more filtering operations on the sampled voltage, if desired) to the differential sample and hold 208. The first reference voltage (e.g., $V_y$), referred to above, may also be conveyed via mux 210 and 212 to differential sample and hold 208. As noted above, the differential voltage produced by the differential sample and hold 208 may be a differential voltage between the sampled voltage (e.g., $V_u$, $V_v$, or $V_w$) and the first reference voltage (e.g., $V_y$). In various embodiments, the logic circuitry may also be coupled to one or more of the mux 210, filter 212, and differential sample and hold 208, e.g., to provide commands and/or control information (for example, to select voltage channel $V_u$, $V_v$, or $V_w$, from which to sample a voltage.

In some embodiments (e.g., motor control), multiple voltage samples may sometimes be taken from a given voltage channel, e.g., at different times. For example, in sampling BEMF in motor implementations, it may be desirable to determine a slope of the BEMF voltage. Thus, some embodiments are considered in which three voltage samples are taken from a voltage channel at specified times within a phase of a commutation cycle of a motor. By sampling three voltages, and converting them to digital representations, a (positive or negative) slope of the BEMF voltage may be determined.

The synchronization of the ramp generator to the frequency of the clock signal may provide significant flexibility to the ADC. For example, adjusting the frequency of the clock (e.g., using a clock divider or programmable oscillator) may effectively modify the range of the ADC. Thus, since the resolution of the conversion may be substantially constant relative to the range of the ADC, the range of the ADC could be scaled down to obtain a high resolution conversion for very small voltage signals, without losing the ability to scale back up and still obtain a good conversion for relatively large voltage signals.

In addition to (or instead of) providing an accurate conversion of an analog voltage signal to a digital representation of the analog voltage signal, the digital pulse train(s) provided by the comparator(s) may be used for one or more other functions, if desired. For example, because the pulse train may be effectively synchronized to the system clock, certain pulse signals may be recognized as being indicative of harmonic multiples of the clock signal; thus, in some embodiments, a circuit such as described herein could be used to detect a phase lock loop, among other possibilities.

Figure 4:
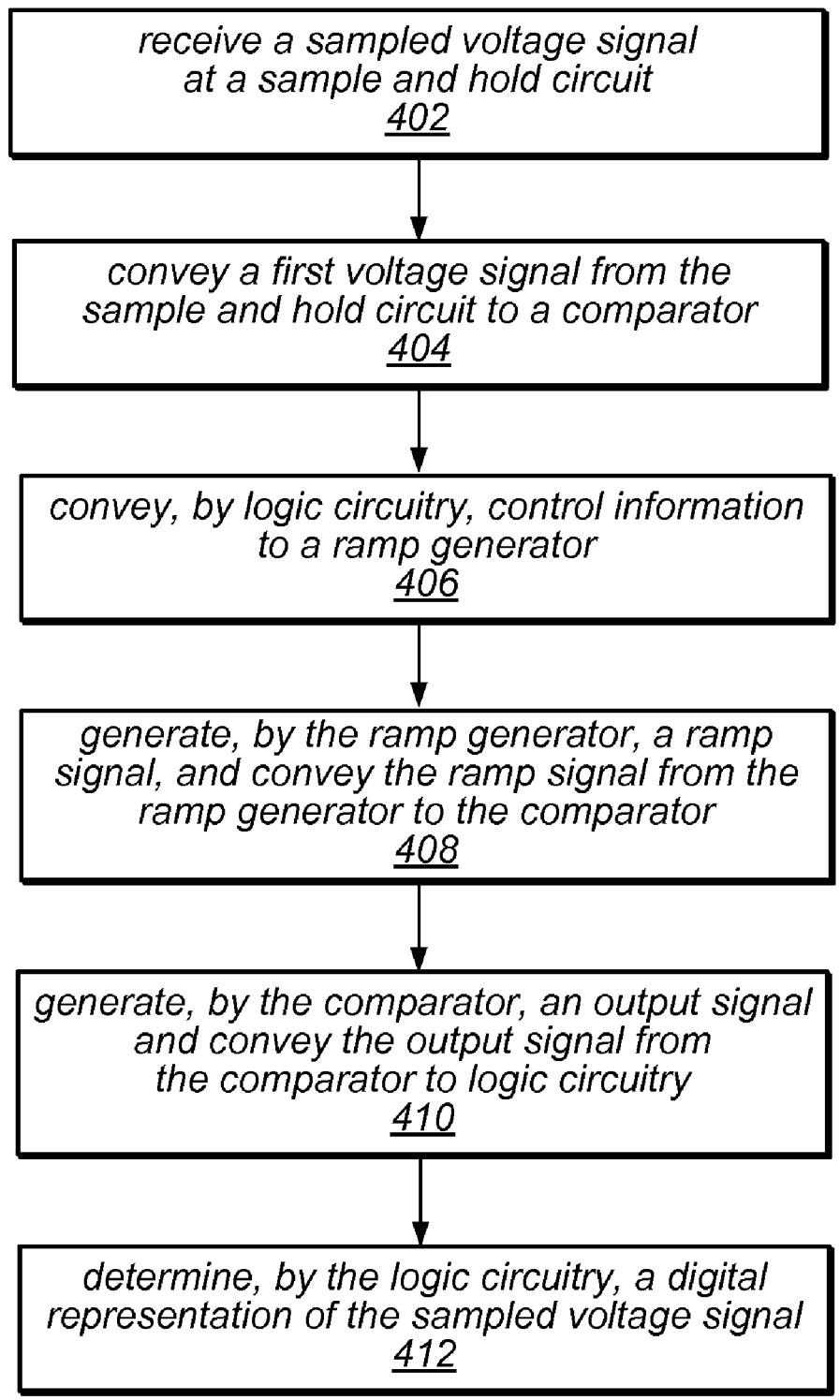
FIG. 4 is a flowchart diagram describing a method for digitizing analog voltage signals according to one embodiment.

FIG. 4—Flowchart Diagram Illustrating a Method for Digitizing Analog Voltage Signals FIG. 4 is a flowchart diagram illustrating a method for digitizing analog voltage signals according to one embodiment. According to some embodiments, the method may be implemented by an ADC such as one of the ADCs shown in FIGS. 2 and 3. Although the method is shown as being performed in a particular order, it should be noted that according to various embodiments, one or more of the steps may be performed concurrently and/or in a different order than shown. In addition, one or more steps shown may be omitted, and/or one or more additional steps may be performed, if desired.

In 402, a sampled voltage signal may be received at a sample and hold circuit. The sampled voltage signal may be a voltage signal for which a digital representation is desired. Alternatively (e.g., if the sampled voltage signal has undergone signal conditioning and/or other operations), the sampled voltage signal may be based on a voltage signal for which a digital representation is desired. In some embodiments, the sample and hold circuit may simply hold the sampled voltage substantially steady as an input (e.g., a first voltage signal) to a comparator.

Alternatively, the sample and hold circuit may in some embodiments be a differential sample and hold circuit. The sample and hold circuit may, for example, also receive a reference voltage signal, and may produce a first voltage signal which is a differential signal, e.g., based on a difference between the sampled voltage signal and the reference voltage signal. In some embodiments, the sample and hold circuit may produce both a positive and a negative version of the first voltage signal. Additionally, in some embodiments, the sample and hold circuit may also receive a second reference voltage signal, which may be used as an offset in producing the first voltage signal. For example, instead of simply producing a positive differential signal and a negative differential signal, in some embodiments the positive differential signal may be the differential signal added to the second reference voltage signal, while the negative differential signal may be the differential signal subtracted from the second reference voltage signal. It should also be noted that in any of the above embodiments, the signal(s) produced by the sample and hold may be amplified, if desired.

In 404, a first voltage signal may be conveyed from the sample and hold circuit to a comparator. The first voltage signal may be produced by the sample and hold circuit according to any of the above described embodiments. For example, if there is only one comparator, the first voltage signal may simply be the sampled voltage signal, or may be an amplified version of the sampled voltage signal. If there are two comparators, the first voltage signal might be a differential signal, e.g., according to any of the above-described embodiments. The comparator might receive the first voltage signal, while a second comparator might receive a second voltage signal (e.g., which could be the same as the first voltage signal, a negative version of the first voltage signal, or otherwise modified relative to the first voltage signal).

In 406, control information may be conveyed by the logic circuitry to the ramp generator. The control information may include a clock signal, e.g., from a system clock. In some embodiments, the clock signal may be variable; for example, a clock divider, or a programmable oscillator, may be used to control the frequency of the clock signal.

In 408, a ramp signal may be generated by a ramp generator and conveyed to the comparator. The ramp signal may be generated based on the clock signal, e.g., from the system clock. For example, the frequency and/or amplitude (e.g., the maximum and/or minimum voltage) of the ramp signal may be based on the clock signal. In some embodiments, the ramp signal may also be generated based on a reference voltage (a "third reference voltage"). The third reference voltage may be used to offset the ramp signal. The third reference voltage may be based on a base reference voltage, which may in some embodiments be the same base reference voltage (e.g., that might be produced by a bandgap voltage reference) upon which the second reference voltage is based. Thus, in some embodiments, the first voltage signal and the ramp signal may be offset by reference voltages which are related and based on the same base reference voltage. In some embodiments, the ramp signal may be a triangular ramp signal.

In 410, an output signal may be generated by the comparator and conveyed to logic circuitry. The comparator may compare the ramp signal and the first voltage signal, and may generate an output signal indicating whether the ramp signal or the first voltage signal is greater. If the ramp signal is a triangular ramp signal, the output may take the form of a digital pulse train, the width of which may effectively digitally represent (or at least provide a digital indication of) the first voltage signal. In some embodiments, e.g., in which there are two comparators, the second comparator may also receive the ramp signal, and may also produce a digital pulse train based on its received second voltage signal and the ramp signal. In some embodiments, the digital pulse trains of the first and second comparators may be combined using an XOR gate, either before or within the logic circuitry.

In 412, a digital representation of the sampled voltage signal may be determined by the logic circuitry. As noted above, the digital pulse train from the comparator(s) may provide a digital indication, or may even be considered a digital representation, of the first voltage signal. For example, based on the control information (e.g., the clock signal) which originates from the logic circuitry and upon which the ramp signal is based, the logic circuitry may be able to interpret the digital pulse train as indicating a particular voltage, and may accordingly determine and produce a digital representation of that voltage.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A system for digitizing analog voltage signals, the system comprising:
    a differential sample and hold circuit configured to receive a sampled voltage signal and a first reference voltage signal;
    a ramp generator configured to convey a triangular ramp signal;
    a first comparator coupled to the ramp generator;
    wherein the differential sample and hold circuit is configured to convey a first voltage signal to one or more of the first comparator and a second comparator, wherein the first voltage signal is a differential voltage signal based on a difference between the sampled voltage signal and the first reference voltage signal, wherein the differential sample and hold circuit is configured to convey the first voltage signal to one or more of the first comparator and the second comparator based on a sign of the first voltage signal;

wherein the first comparator is configured to receive the first voltage signal and the triangular ramp signal and produce a first output based on whether the first voltage signal or the triangular ramp signal is greater, wherein the first output of the first comparator switches on both rising and falling edges of the triangular ramp signal, thereby producing a first digital pulse train;

logic circuitry coupled to the ramp generator and to the first comparator, wherein the logic circuitry is configured to provide control information to the ramp generator, wherein the logic circuitry is also configured to receive the first digital pulse train, wherein the logic circuitry is further configured to use the first digital pulse train and the control information to determine a digital representation of the first voltage signal.

2. The system of claim 1,
wherein one or more of the sample and hold circuit or the first comparator are configured to reduce an offset voltage.

3. The system of claim 1,
wherein the ramp generator is configured to receive a second reference voltage signal, wherein the second reference voltage is used in generating the triangular ramp signal, wherein the first reference voltage signal and the second reference voltage signal are proportional to a base reference voltage signal.

4. The system of claim 1,
wherein the control information comprises a clock signal, wherein the ramp generator is configured to generate the triangular ramp signal based on the clock signal.

5. The system of claim 1,
wherein the ramp generator is configured to receive a reference voltage, wherein the control information comprises a clock signal, wherein the triangular ramp signal is based on the clock signal and the reference voltage.

6. The system of claim 1,
wherein the triangular ramp signal and the first voltage signal are analog voltage signals.

7. A method for digitizing analog voltage signals, comprising:
receiving a sampled voltage signal at a differential sample and hold circuit, wherein the differential sample and hold circuit also receives a first reference voltage signal;
conveying, by the sample and hold circuit, a first voltage signal to a first comparator, wherein the first voltage signal is a differential voltage signal based on a difference between the sampled voltage signal and the first reference voltage signal, wherein the first comparator is one of two comparators coupled to the sample and hold circuit, wherein said conveying the first voltage signal to the first comparator is based on a sign of the first voltage signal;
receiving the first voltage signal at the first comparator;
receiving a triangular ramp signal at the first comparator, wherein the triangular ramp signal is generated by a ramp generator;
generating, by the first comparator, a first digital pulse train, wherein the first comparator produces a first output based on whether the first voltage signal or the triangular ramp signal is greater, wherein the first output of the first comparator switches on both rising and falling edges of the triangular ramp signal, thereby producing the first digital pulse train;
conveying the first digital pulse train, by the first comparator, to logic circuitry;

conveying, by the logic circuitry, control information to the ramp generator, wherein the ramp generator generates the triangular ramp signal based on the control information;
determining, by the logic circuitry, a digital representation of the first voltage signal, wherein said determining is based on the first digital pulse train from the comparator and the control information.

8. The method of claim 7,
wherein one or more of the sample and hold circuit or the first comparator are configured to reduce an offset voltage.

9. The method of claim 7, further comprising:
receiving, by the ramp generator, a second reference voltage signal, wherein the second reference voltage is used in generating the triangular ramp signal, wherein the first reference voltage signal and the second reference voltage signal are proportional to a base reference voltage signal.

10. The method of claim 7,
wherein the control information comprises a clock signal, wherein the triangular ramp signal is generated by the ramp generator based on the clock signal.

11. The method of claim 7, further comprising:
receiving, by the ramp generator, a reference voltage signal;
wherein the control information comprises a clock signal;
wherein the ramp generator generates the triangular ramp signal based on the clock signal and the reference voltage.

12. The method of claim 7, wherein the triangular ramp signal and the first voltage signal are analog voltage signals.

13. A system for digitizing analog voltage signals, the system comprising:
a ramp generator configured to convey a triangular ramp signal;
a first comparator coupled to the ramp generator, wherein the first comparator is configured to receive a first voltage signal and the triangular ramp signal and produce a first output based on whether the first voltage signal or the triangular ramp signal is greater, wherein the first output of the first comparator switches on both rising and falling edges of the triangular ramp signal, thereby producing a first digital pulse train;
a second comparator coupled to the ramp generator, wherein the second comparator is configured to receive the first voltage signal and the triangular ramp signal and produce a second output based on whether the first voltage signal or the ramp signal is greater, wherein the second output of the second comparator switches on both rising and falling edges of the triangular ramp signal, thereby producing a second digital pulse train,
wherein the second comparator is configured to receive an inverted version of one or more of the first voltage signal and the triangular ramp signal, wherein the second digital pulse train comprises an inverted version of the first digital pulse train;
logic circuitry coupled to the ramp generator, the first comparator, and the second comparator, wherein the logic circuitry is configured to provide control information to the ramp generator, wherein the logic circuitry is also configured to receive the first and second digital pulse trains, wherein the logic circuitry is further configured to use the first and second digital pulse trains and the control information to determine a digital representation of the first voltage signal.

14. The system of claim 13, wherein the system further comprises:
an XOR circuit coupled to the first output of the first comparator and the second output of the second comparator, wherein the XOR circuit is configured to perform an XOR operation on the first digital pulse train and the second digital pulse train to produce a third digital pulse train;
wherein the logic circuitry is configured to receive the third digital pulse train from the XOR circuit and use the third digital pulse train and the control information to determine the digital representation of the first voltage signal.

15. The system of claim 4,
wherein the ramp generator is configured to generate the triangular ramp signal based on a frequency of the clock signal, wherein the logic circuitry is configured to adjust the frequency of the clock signal to modify a range of the system.

16. A method for digitizing analog voltage signals, comprising:
receiving a first voltage signal at a first comparator;
receiving the first voltage signal at a second comparator;
receiving a triangular ramp signal at the first comparator, wherein the triangular ramp signal is generated by a ramp generator;
receiving the triangular ramp signal at the second comparator;
generating, by the first comparator, a first digital pulse train, wherein the first comparator produces a first output based on whether the first voltage signal or the triangular ramp signal is greater, wherein the first output of the first comparator switches on both rising and falling edges of the triangular ramp signal, thereby producing the first digital pulse train;
generating, by the second comparator a second digital pulse train, wherein the second comparator produces a second output based on whether the first voltage signal or the triangular ramp signal is greater, wherein the second output of the second comparator switches on both rising and falling edges of the triangular ramp signal, thereby producing the second digital pulse train;
wherein the second comparator is configured to receive inverted versions of one or more of the first voltage signal and the triangular ramp signal, wherein the second digital pulse train comprises an inverted version of the first digital pulse train;
conveying the first digital pulse train, by the first comparator, to logic circuitry;
conveying the second digital pulse train, by the second comparator, to the logic circuitry;
conveying, by the logic circuitry, control information to the ramp generator, wherein the ramp generator generates the triangular ramp signal based on the control information;
determining, by the logic circuitry, a digital representation of the first voltage signal, wherein said determining is based on the first digital pulse train from the first comparator, the second digital pulse train from the second comparator, and the control information.

17. The method of claim 16, wherein the method further comprises:
receiving, by an XOR circuit, the first digital pulse train and the second digital pulse train;
generating, by the XOR circuit, a third digital pulse train, wherein said generating the third digital pulse train comprises performing an XOR operation on the first digital pulse train and the second digital pulse train;
conveying the third digital pulse train to the logic circuitry;
wherein determining the digital representation of the first voltage signal by the logic circuitry is based on the third digital pulse train and the control information.

18. The method of claim 10, wherein the triangular ramp signal is generated by the ramp generator based on a frequency of the clock signal, the method further comprising:
adjusting, by the logic circuitry, the frequency of the clock signal, thereby modifying a range of the system.

\* \* \* \* \*